(12) United States Patent
Kawano et al.

(10) Patent No.: US 7,807,567 B2
(45) Date of Patent: Oct. 5, 2010

(54) SEMICONDUCTOR DEVICE WITH INTERCONNECTION STRUCTURE FOR REDUCING STRESS MIGRATION

(75) Inventors: Masaya Kawano, Kawasaki (JP); Yoshiaki Yamamoto, Kawasaki (JP); Takamasa Ito, Kawasaki (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 11/703,701

(22) Filed: Feb. 8, 2007

(65) Prior Publication Data
US 2007/0275554 A1 Nov. 29, 2007

Related U.S. Application Data

(62) Division of application No. 10/855,562, filed on May 28, 2004.

(30) Foreign Application Priority Data
May 30, 2003 (JP) ............................. 2003-154728

(51) Int. Cl.
*H01L 21/4763* (2006.01)
(52) U.S. Cl. ............... 438/640; 257/774; 257/E21.578; 257/E21.579
(58) Field of Classification Search ......... 257/773–775, 257/E23.145, E23.011, E21.578, E21.579, 257/E21.585; 438/637, 640, 672
See application file for complete search history.

(56) References Cited

U.S. PATENT DOCUMENTS

| | | | | |
|---|---|---|---|---|
| 4,764,245 A | * | 8/1988 | Grewal | .................. 438/700 |
| 4,835,597 A | * | 5/1989 | Okuyama et al. | ........... 257/634 |
| 5,180,689 A | * | 1/1993 | Liu et al. | .................... 438/640 |
| 5,203,957 A | * | 4/1993 | Yoo et al. | .................... 438/640 |
| 5,453,403 A | * | 9/1995 | Meng et al. | ................. 438/734 |
| 5,629,237 A | * | 5/1997 | Wang et al. | ................. 438/701 |

(Continued)

FOREIGN PATENT DOCUMENTS

JP 2-116129 A 4/1990

(Continued)

OTHER PUBLICATIONS

T. Oshima et al., "Suppression of Stress-Induced Voiding in Copper Interconnects" IEDM, 2002, pp. 1-4.

*Primary Examiner*—Lex Malsawma
*Assistant Examiner*—William F Kraig
(74) *Attorney, Agent, or Firm*—Sughrue Mion, PLLC

(57) ABSTRACT

The semiconductor device of the present invention includes a first interconnection, a via-plug that is connected to the first interconnection, and a second interconnection that is formed as a single unit with the via-plug. The cross-sectional shape of the via-plug is such that the plug sidewall angle, which indicates the angle of the via-plug sidewall with respect to the surface of the first interconnection, is a positive angle; and moreover, at least two points exist between the base and the top of the via-plug on at least one sidewall of the two sidewalls of the cross-sectional shape of the via-plug at which the plug sidewall angle attains a maximum value. Since shapes that would give rise to the occurrence of concentrations of stress are not formed in the via-plug sidewalls, metal is more effectively embedded in the via-hole, and the incidence of voids is prevented.

3 Claims, 11 Drawing Sheets

U.S. PATENT DOCUMENTS

| | | | |
|---|---|---|---|
| 6,251,774 B1 * | 6/2001 | Harada et al. | 438/637 |
| 6,277,757 B1 | 8/2001 | Lin | |
| 6,300,683 B1 * | 10/2001 | Nagasaka et al. | 257/774 |
| 6,323,121 B1 * | 11/2001 | Liu et al. | 438/633 |
| 6,352,938 B2 * | 3/2002 | Chen et al. | 438/725 |
| 6,410,437 B1 * | 6/2002 | Flanner et al. | 438/689 |
| 6,448,177 B1 * | 9/2002 | Morrow et al. | 438/638 |
| 6,455,411 B1 * | 9/2002 | Jiang et al. | 438/624 |
| 6,465,889 B1 * | 10/2002 | Subramanian et al. | 257/760 |
| 6,514,856 B2 * | 2/2003 | Matsumoto | 438/637 |
| 6,514,860 B1 * | 2/2003 | Okada et al. | 438/687 |
| 6,583,046 B1 * | 6/2003 | Okada et al. | 438/622 |
| 6,632,707 B1 * | 10/2003 | Wang et al. | 438/110 |
| 6,689,695 B1 * | 2/2004 | Lui et al. | 438/700 |
| 6,713,386 B1 * | 3/2004 | Hu et al. | 438/639 |
| 6,767,827 B1 * | 7/2004 | Okada et al. | 438/638 |
| 6,800,550 B2 * | 10/2004 | Ryu | 438/637 |
| 7,094,688 B2 * | 8/2006 | Oryoji | 438/638 |
| 7,354,856 B2 * | 4/2008 | Yeh et al. | 438/638 |
| 7,564,136 B2 * | 7/2009 | Yeh et al. | 257/773 |
| 2002/0008323 A1 * | 1/2002 | Watanabe et al. | 257/758 |
| 2003/0027413 A1 * | 2/2003 | Tsui | 438/586 |
| 2003/0201537 A1 * | 10/2003 | Lane et al. | 257/751 |

FOREIGN PATENT DOCUMENTS

| | | |
|---|---|---|
| JP | H10-163207 | 6/1998 |
| JP | 11-284068 A | 10/1999 |
| JP | 2000-91428 A | 3/2000 |
| JP | 2001-110896 | 4/2001 |
| JP | 2003-100864 A | 4/2003 |

* cited by examiner

DISTANCE FROM THE TOP

SEMICONDUCTOR DEVICE WITH INTERCONNECTION STRUCTURE FOR REDUCING STRESS MIGRATION

This is a divisional of application Ser. No. 10/855,562 filed May 28, 2004. The entire disclosure of the prior application, application Ser. No. 10/855,562 is hereby incorporated by reference.

BACKGROUND OF THE INVENTION

1. Field of the Invention

The present invention relates to a semiconductor device having interconnections and a via-plug for connecting the interconnections together, and to a fabrication method for such a semiconductor device.

2. Description of the Related Art

Among semiconductor devices such as memory and logic devices are those that conventionally include an interconnection structure in which interconnections are connected together by via-plugs. FIG. 1 is a sectional view showing an example of the configuration of a semiconductor device of the prior art. As shown in FIG. 1, the semiconductor device is a configuration that includes: interconnection 120 on lower dielectric film 110 that is formed on a semiconductor substrate (not shown); via-plug 230 that is connected to interconnection 120; and interconnection 140 that is connected to via-plug 230. Via-plug 230 and interconnection 140 are formed as a single unit.

The effect of the shape of via-plugs upon stress migration in such an interconnection structure has previously been documented (T. Oshima et al., "Suppression of stress-induced voiding in copper interconnects," IEDM (2002)).

However, although the effect of the shape of via-plugs upon stress migration has been touched upon in the above-described literature, nothing has been disclosed regarding methods of solving this problem, and it is unclear how stress migration can be reduced.

SUMMARY OF THE INVENTION

It is an object of the present invention to provide a semiconductor device having an interconnection structure for reducing stress migration and a method of fabricating such a semiconductor device.

The semiconductor device of the present invention includes: a first interconnection; a via-plug that connects to the first interconnection; and a second interconnection that is formed as a unit with the via-plug; wherein a cross-sectional shape of the via-plug is a configuration in which a plug sidewall angle, which indicates an angle of the via-plug sidewall with respect to the surface of the first interconnection, is a positive angle; and moreover, that has at least two points between a base and a top of the via-plug on at least one of the two sidewalls of the cross-sectional shape of the via-plug at which the plug sidewall angle attains a maximum value.

More specifically, the plug sidewall angle is an angle formed between: a line that joins an arbitrary point of a sidewall of the via-plug and a point of intersection of a line that passes through that arbitrary point and that is parallel to the first interconnection and a central axis of the via-plug; and a line that joins that arbitrary point and a point of intersection between a tangent line at that arbitrary point and the central axis. In addition, regarding the plug sidewall angle, an angle of depression from a line that is parallel to the surface of the first interconnection is a positive angle, and an angle of elevation from a line that is parallel to the first interconnection is a negative angle.

In the present invention, the plug sidewall angle in the cross-sectional shape of the via-plug does not become a negative angle, and as a result, shape that would cause stress to concentrate are not formed in the via-plug sidewalls of the via-plug cross-sectional shape. In addition, because a minimum value exists between the two maximum values for the plug sidewall angle, an inclination of the sidewall changes such that a via-hole diameter increases midway from the via-plug base to the top, and the essential aspect ratio of the via-hole is therefore smaller than for a simple tapered shape.

In addition, if the plug sidewall angle is a positive angle at any point of the via-plug sidewall, a sidewall shape will be formed in which the plug sidewall angles are positive angles for all of the via-plug sidewalls. As a result, a shape that would cause stress to concentrate is not formed on any of the via-plug sidewalls.

In addition, when the plug sidewall angle is less than or equal to 90°, the via-hole sidewalls will have a shape that is amenable to burying metal in the via-hole interior.

Still further, if the plug sidewall angle is a continuous value between the maximum values, the via-hole sidewalls will have a gentle shape between the points on the sidewalls at which the plug sidewall angles attain maximum values even if the plug sidewall angle has a maximum value that approaches 90°. As a result, a shape that would give rise to concentrations of stress will not be formed even when an angle of 90° is approached or between differing inclinations.

In addition, the amenability of the via-hole interiors to filling with metal is further improved when the plug sidewall angle is less than 90° between the via-plug base and the points on via-plug sidewalls at which the plug sidewall angle becomes a minimum value between maximum values.

Moreover, the amenability of the via-hole interiors to filling with metal is further improved if a metal diffusion barrier film is included on the first interconnection, and if the plug sidewall angle at the position of the side surface of the metal diffusion barrier film is less than 90°.

Accordingly, shapes that would bring about a concentration of stress are not formed on the via-plug sidewalls in the semiconductor device of the present invention, and as a result, the via-hole interior is more amenable to filling with metal, and the occurrence of voids can be prevented. Moreover, stress migration is reduced and the reliability of the interconnections is improved.

The above and other objects, features, and advantages of the present invention will become apparent from the following description with reference to the accompanying drawings, which illustrate examples of the present invention.

DETAILED DESCRIPTION OF THE PREFERRED EMBODIMENTS

First Working Example

Figure 2A:
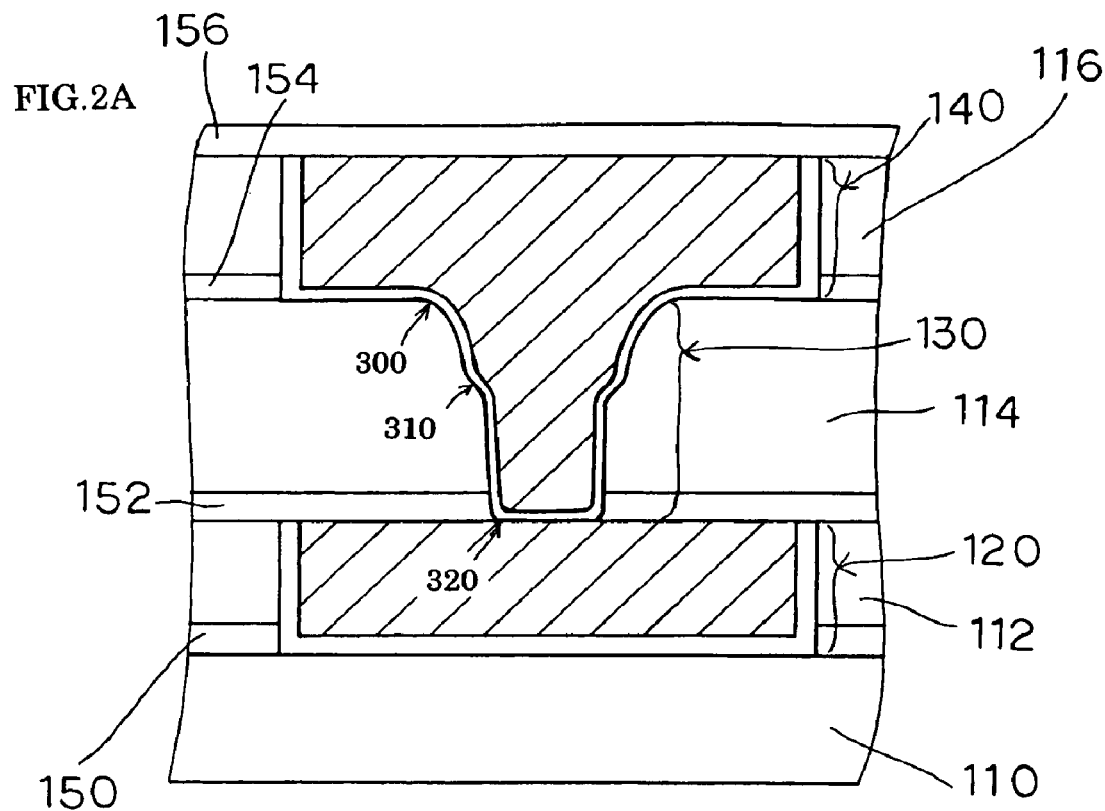
FIG. 2A is a sectional view showing an example of the configuration of a semiconductor device of the present invention.

As shown in FIG. 2A, the semiconductor device is a configuration that includes: interconnection 120 on lower dielectric film 110 that is formed on a semiconductor substrate (not shown); via-plug 130 that is connected to interconnection 120; and interconnection 140 that is connected to via-plug 130. Via-plug 130 and interconnection 140 are formed as a single unit. Interconnection 120, via-plug 130, and interconnection 140 each include the conductive material copper (Cu) and a barrier metal film for preventing diffusion of the copper.

Intralayer dielectric film 112 for insulating interconnection 120 from interconnections that are formed on the same level is formed on lower dielectric film 110. The upper surface of interconnection 120 is covered by Cap-SiCN film 152, which forms a metal diffusion prevention film for preventing the diffusion of copper at points other than the points of connection with via-plug 130. Interconnection 140 is formed in intralayer dielectric film 116, and interlayer dielectric film 114 is formed between interconnection 120 and interconnection 140. Cap-SiCN film 156 is formed as a metal diffusion prevention film on interconnection 140.

Stopper-SiC film 150 is formed to act as an etching stopper film between lower dielectric film 110 and intralayer dielectric film 112. Stopper-SiC film 154 is formed as an etching stopper film between interlayer dielectric film 114 and intralayer dielectric film 116.

Interlayer dielectric film 114 is a silicon oxide film. Intralayer dielectric film 112 and intralayer dielectric film 116 are ladder oxide films having a ladder-type hydrogenated siloxane structure. In the following explanation, ladder oxide films are referred to as "L-Ox (a registered trademark of NEC Electronics Corporation) films".

Semiconductor elements such as transistors, resistors, capacitors are formed on the semiconductor substrate, but the structure of the semiconductor elements is similar to that of semiconductor elements of the prior art, and detailed explanation of this structure is therefore here omitted.

The following explanation regards the angles of the sidewalls of the via-plug in the sectional shape of the semiconductor device that is shown in FIG. 2A.

Figure 3:
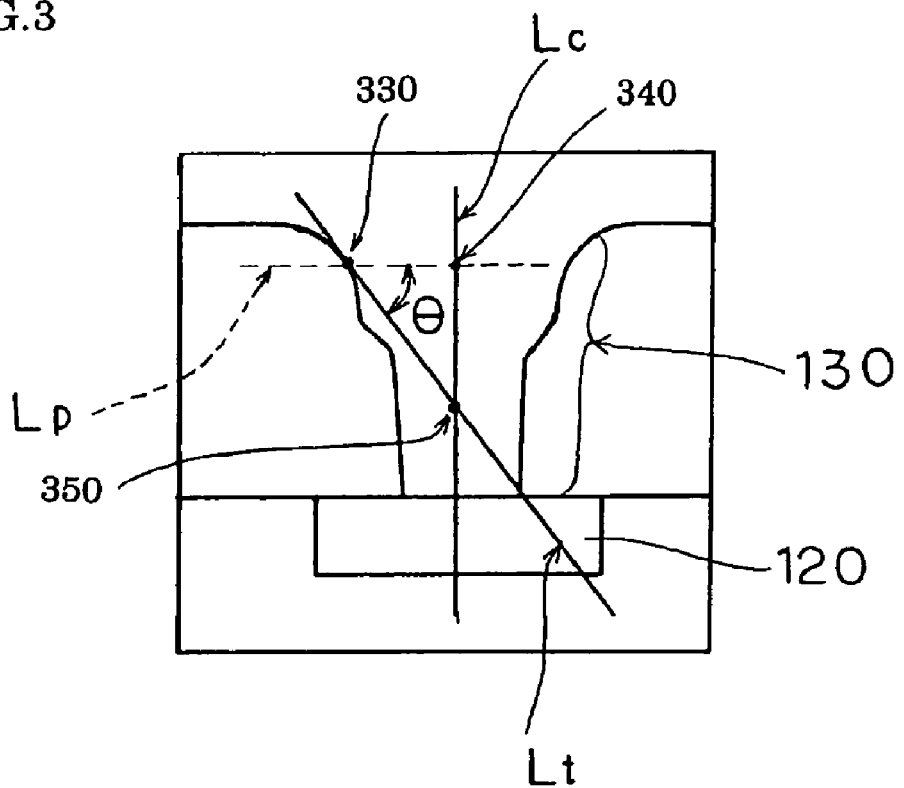
FIG. 3 is a schematic view showing the sectional shape of a via-plug.

FIG. 3 is a schematic view showing the sectional shape of a via-plug. In FIG. 3, via-plug 130 is connected to interconnection 120. Lt is a line that is tangent to an arbitrary point 330 of the via-plug sidewall, and Lp is a line at point 330 that is parallel to the surface of interconnection 120. Further, Lc is the central axis of the via-plug. Point 340 is the point of intersection between line Lp at point 330 and central axis Lc, and point 350 is the point of intersection between tangent line Lt at point 330 and central axis Lc. Plug sidewall angle θ is the angle formed between the line formed by joining point 340 and point 330 and the line formed by joining point 330 and point 350. In addition, the angle of depression from line Lp for this plug sidewall angle is a positive angle, and the angle of elevation from line Lp is a negative angle.

In the semiconductor device that is shown in FIG. 2A, the above-described plug sidewall angle is a positive angle greater than 0° and less than or equal to 90° from the top of the via-plug at the base of interconnection 140 to the base of the via-plug. This point is explained hereinbelow using a graph that shows the shape of the via-plug sidewall.

Figure 4:
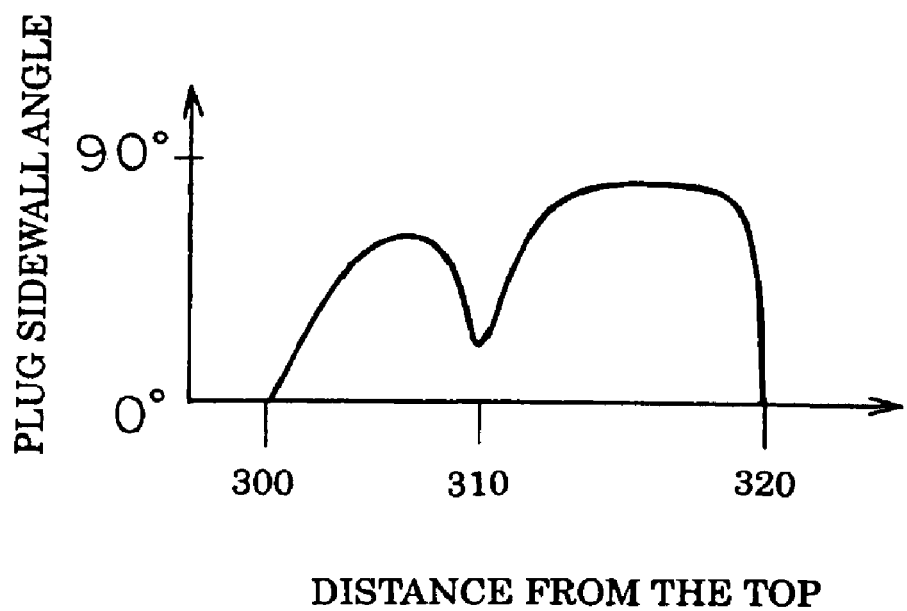
FIG. 4 is a graph showing the via-plug sidewall shape in the semiconductor device shown in FIG. 2A.

FIG. 4 is a graph showing the shape of the via-plug sidewall of the semiconductor device shown in FIG. 2A. The vertical axis shows the value of the plug sidewall angle, and the horizontal axis shows the distance from the top of the via-plug when tracing the sidewall of the via-plug shown in FIG. 2A. Point 300 on the horizontal axis shows the top of the via-plug, and point 320 shows the base of the via-plug. Point 310 shows an intermediate point between point 300 and point 320.

As shown in FIG. 4, the plug sidewall angle increases gradually from the angle at point 300, and decreases gradually upon exceeding a maximum value. After attaining a minimum value at point 310, the angle again gradually increases to reach a maximum value, whereupon the angle decreases up to point 320. The plug sidewall angle is never a negative angle, and sidewall of the via-plug is therefore formed in a smooth shape. In addition, as shown in the graph, the plug sidewall angle has two maximum values, is a continuous value between the two maximum values, and has no discontinuous points. The plug sidewall angle varies gradually before and after point 310 and does not change radically even at point 310 where the plug sidewall angle reaches a minimum value. Although the sidewall angle does not attain 90° in this graph, points with a 90° are permissible.

As with the above-described plug sidewall shape, the plug sidewall angle does not become a negative angle, and there are consequently no areas that would give rise to a concentration of stress. As a result, stress migration in the via-plug is reduced. In the shape of the via-plug sidewall, moreover, the plug sidewall angle has at least two maximum values, and further, has a minimum value between these maximum values. At the point of this minimum value, the inclination of the sidewalls changes such that the diameter of the via-hole (hereinbelow referred to as "via-hole diameter") increases midway from the base of the via-plug to the top of the via-plug, and the essential aspect ratio of the via-hole therefore is smaller than that of a simple tapered shape. As a result, the via-hole is more amenable to filling when the via-hole is filled with copper. As a result of these factors, stress migration inside the via-plug is reduced and an interconnection having high reliability is obtained.

Figure 2B:
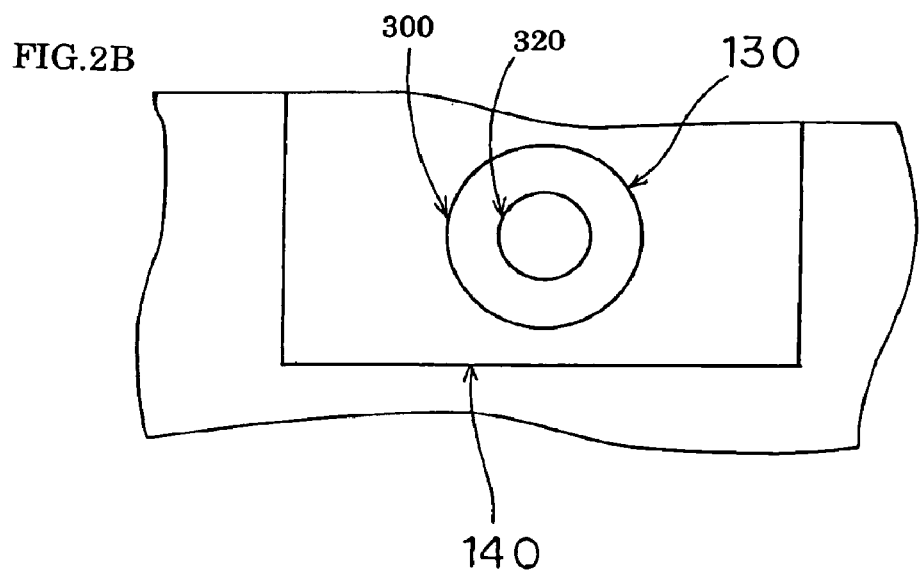
FIG. 2B is a plan view showing an example of the configuration of the semiconductor device of the present invention.

FIG. 2B is a plan view showing the pattern of interconnection 140 and via-plug 130. Point 300 of FIG. 2B shows the top of the via-plug, and point 320 shows the base of the via-plug. As shown in FIG. 2B, the shape of the sidewall from via-plug base 320 to via-plug top 300 that is shown in FIG. 2A is formed on all of the via-plug sidewalls.

The following explanation regards the shape of the above-described via-plug sidewalls for a case in the prior art. The film configuration of the semiconductor device of the prior art is similar to that of the semiconductor device of the present invention shown in FIG. 2A, and a detailed explanation of this configuration is therefore omitted.

Figure 1:
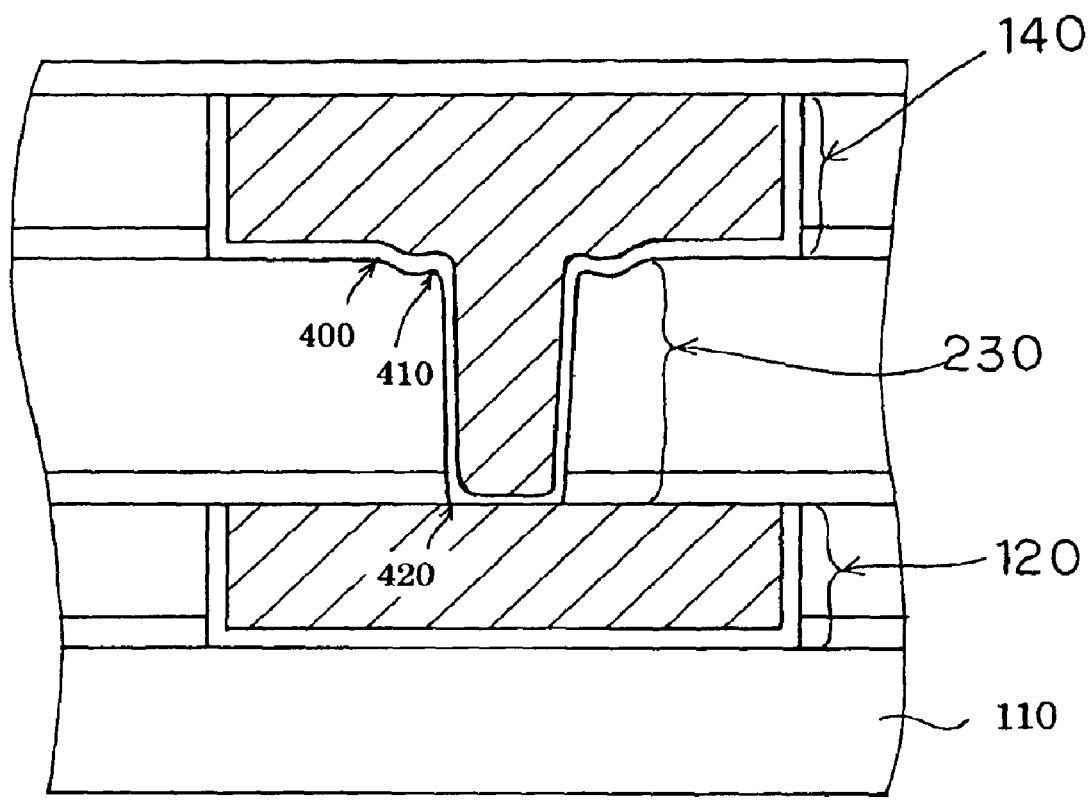
FIG. 1 is a sectional view showing an example of the configuration of a semiconductor device of the prior art.

As shown in FIG. 1, a protuberance is formed at the position shown by point 410 on the sidewalls of via-plug 230. This shape is next explained using a graph that shows the plug sidewall angle.

Figure 5:
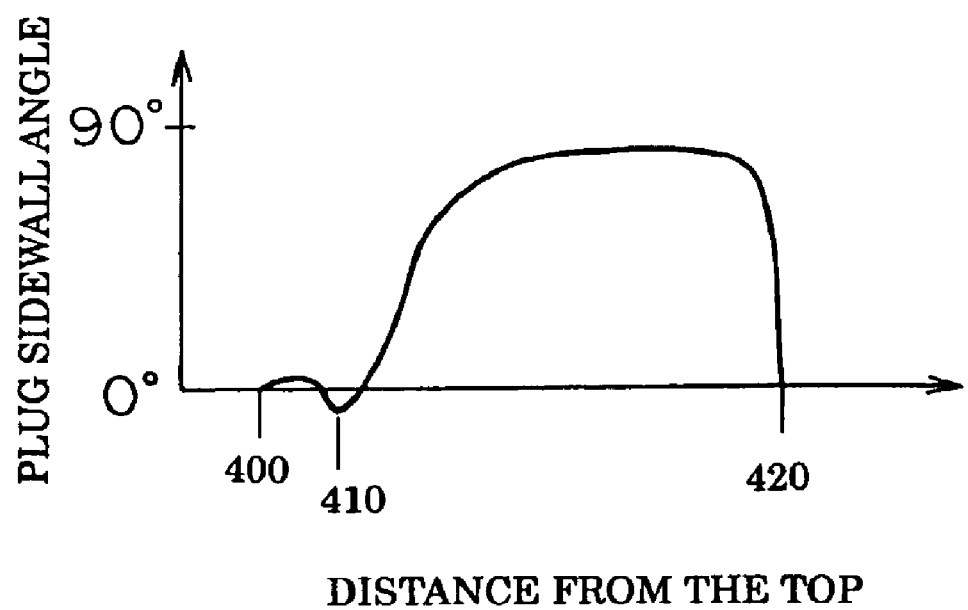
FIG. 5 is a graph showing the via-plug sidewall shape of the semiconductor device shown in FIG. 1.

FIG. 5 is a graph showing the shape of the via-plug sidewall of the semiconductor device shown in FIG. 1. The vertical axis shows the value of the plug sidewall angle, and the horizontal axis shows the distance from the top of the via-plug when tracing the via-plug sidewall that is shown in FIG. 1. Point 400 on the horizontal axis shows the via-plug top, and point 420 shows the via-plug base. Point 410 shows an intermediate point between point 400 and point 420.

As shown in FIG. 5, the plug sidewall angle first increases from point 400 that indicates the via-plug top, but after attaining a maximum value, decreases and then becomes a negative angle at point 410. From point 410, the plug sidewall angle again increases, and after continuing as a substantially fixed value, drops precipitously to point 420 (0°). A protuberance is thus formed at the position at which the plug sidewall angle becomes a negative angle. Stress is consequently focused at the protuberance in the via-hole, and stress migration tends to occur in the via-plug. In addition, the via-hole is not amenable to filling with copper, and voids tend to occur in the via-plug. The formation of voids decreases the product yield, and further, leads to the breakdown of connections between interconnection 120 and interconnection 140 as voids grow in the course of extended use of the semiconductor device.

The following explanation regards an appraisal of stress migration for the interconnection structures of the semiconductor device shown in FIG. 2A and the semiconductor device shown in FIG. 1. In this explanation, Sample A is a sample produced according to the interconnection structure of the semiconductor device shown in FIG. 2A, and Sample B is a sample produced according to the interconnection structure of the semiconductor device shown in FIG. 1. In addition, interconnection 120 is referred to as "lower-metal," and interconnection 140 is referred to as "upper-metal."

In this appraisal, a via-chain TEG (Test Element Group) was used in which the connections of the lower-metal, via-plug and upper-metal were formed by repeating a prescribed number of times. In addition, several conditions were set regarding the interconnection width of the upper-metal based on a range of 0.2-10 μm, where the interconnection width is the direction that is perpendicular to the longitudinal direction of the interconnections in the planar pattern of the interconnections. The interconnection width of the lower-metal was fixed.

Experimentation was carried out as follows: Samples A and Samples B were each fabricated, a plurality of via-chain TEGs being formed according to the above-described conditions. Samples A and Samples B were next kept at a temperature of 150° C. for 168 hours, following which the via-chain TEGs were subjected to the application of voltage and then checked to determine whether current flowed. Via-chain TEGs in which current did not flow at this time were determined to be defective due to stress migration.

The above-described conditions on the interconnection width of the upper-metal in this appraisal were established because stress migration failures tend to occur with increase in the interconnection width of the upper-metal.

Regarding the reasons for this phenomenon, heat treatment in the process of fabricating a semiconductor device causes residual tensile stress in interconnections. Stress migration is the phenomenon by which metal atoms move through the interconnections or via-plugs to relieve this tensile stress. Voids are generated in a via-plug to relieve the stress of the upper-metal. When the interconnection width of the upper-metal is small, the stress is relieved even though the volume of the voids is small. In contrast, when the interconnection width is great, the alleviation of stress is inadequate when the volume of the voids is small, and voids of greater volume are therefore necessary for relieving stress. However, the occurrence of voids having large volume in the via-plug leads to the connection failure of the via-plug.

Figure 6:
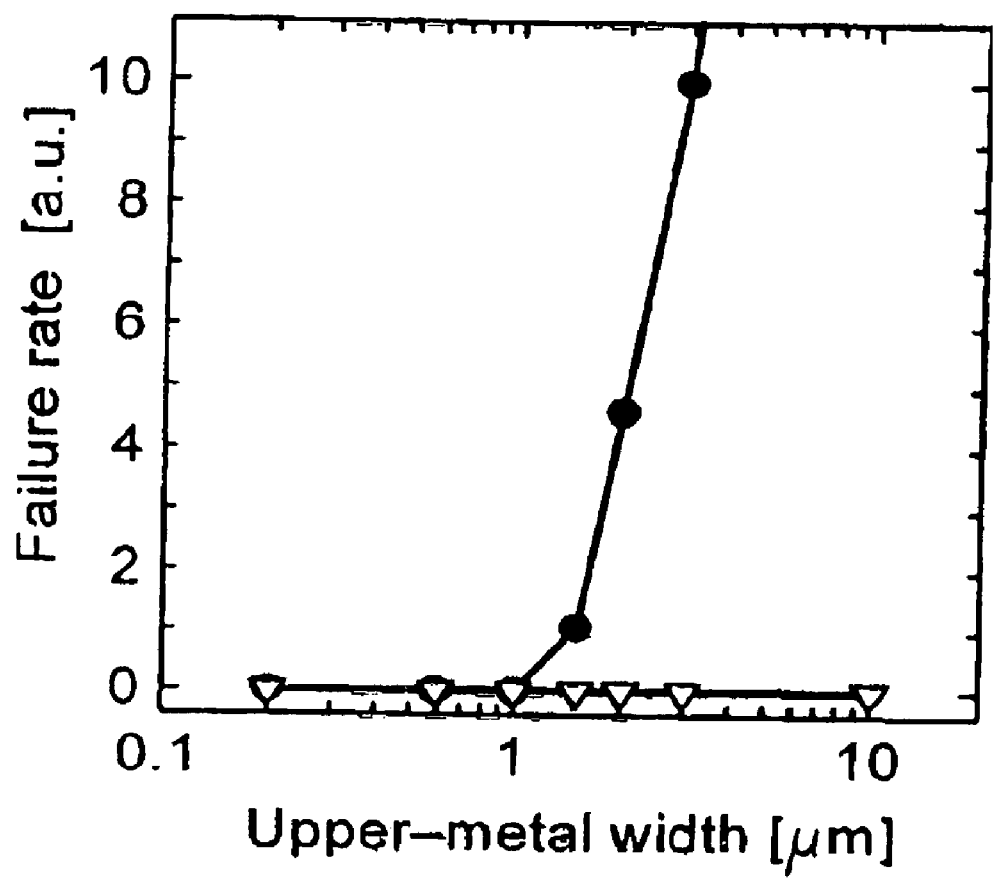
FIG. 6 is a graph showing the dependency of stress migration failure rate upon the interconnection width of the upper metal.

Regarding the results of the appraisal of stress migration, FIG. 6 is a graph showing the dependence of the stress migration failure rate upon the interconnection width of the upper-metal. The horizontal axis shows the interconnection width of the upper-metal, and the vertical axis shows the stress migration failure rate (hereinbelow referred to as simply the "failure rate"). The value of the failure rate for Sample A is plotted by blank triangles, while the failure rate for Sample B is plotted using solid dots.

As shown in FIG. 6, the failure rate was 0 for Sample A despite increase of the interconnection width of the upper-metal from 0.2 μm to 10 μm. In contrast, failures occurred in Sample B when the interconnection width of the upper-metal became greater than 1 μm, and the failure rate continued to increase as the interconnection width increased. Based on the reasons described hereinabove, it is believed that when the interconnection width of the upper-metal exceeded 1 μm in Sample B, voids occurred that promoted breaks in the connections of the via-plug.

Based on the results shown in FIG. 6, it can be seen that the stress migration characteristic of Sample A is far superior to that of Sample B. As the reason for this difference, points that would cause concentrations of stress do not occur in Sample A because the plug sidewall angle never becomes a negative angle, while protuberances are formed in Sample B at points in which the plug sidewall angle becomes a negative angle.

The following explanation regards a method of fabricating the semiconductor device that is shown in FIG. 2A. The explanation here regards a dual damascene method in which via-plug 130 and interconnection 140 are formed as a single unit.

Figure 7A:
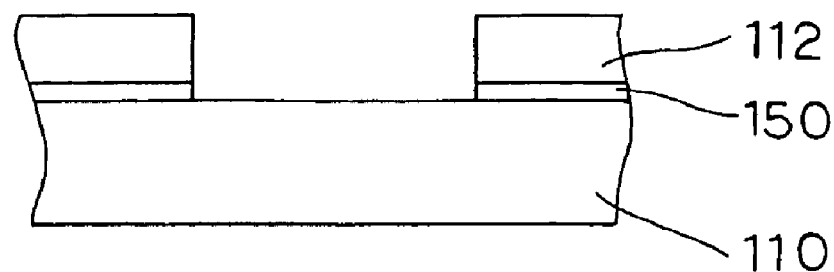
FIGS. 7A to 7N are sectional views showing the method of fabricating the semiconductor device of the present invention.
Figure 7B:
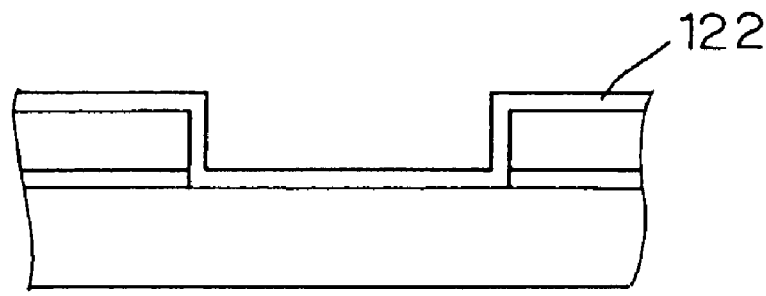
Figure 7C:
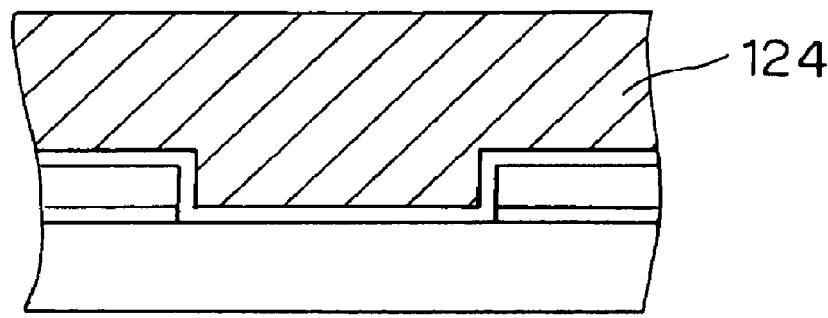
Figure 7D:
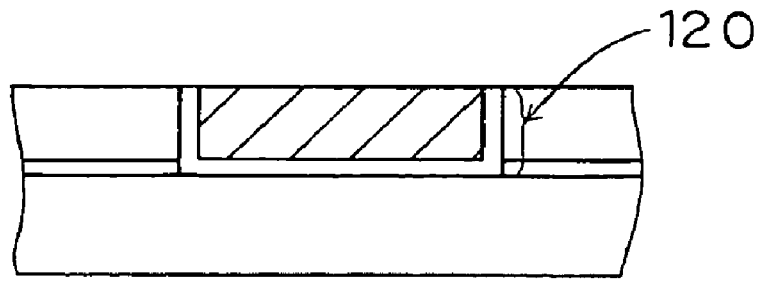
Figure 7E:
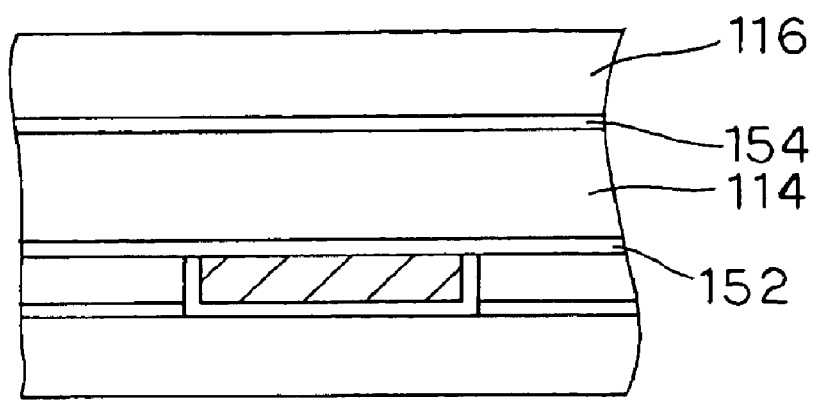
Figure 7F:
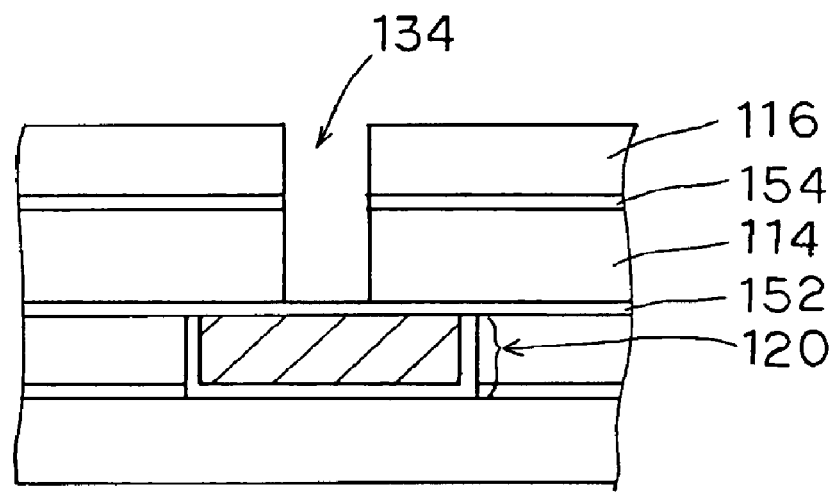
Figure 7G:
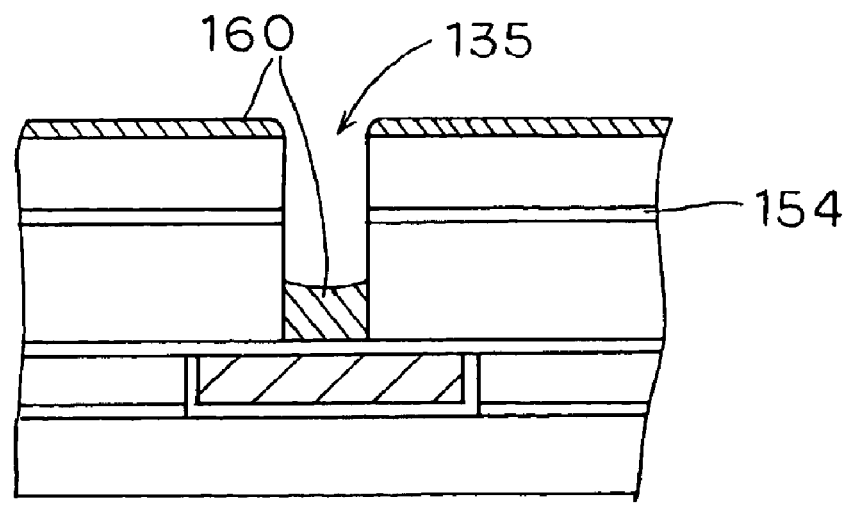
Figure 7H:
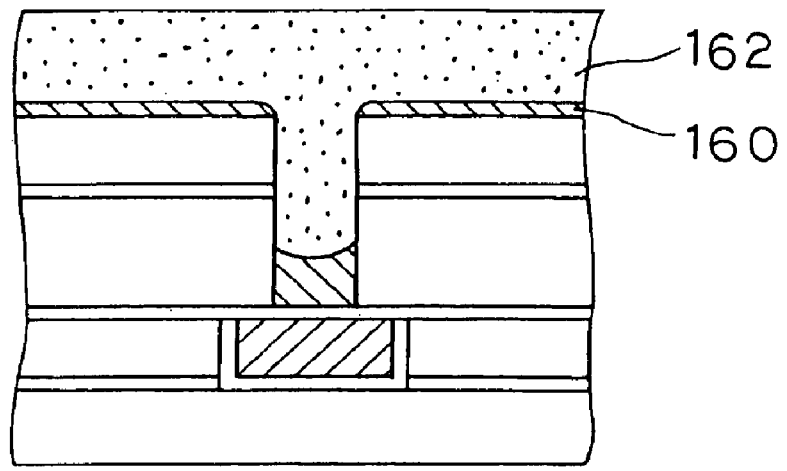
Figure 7I:
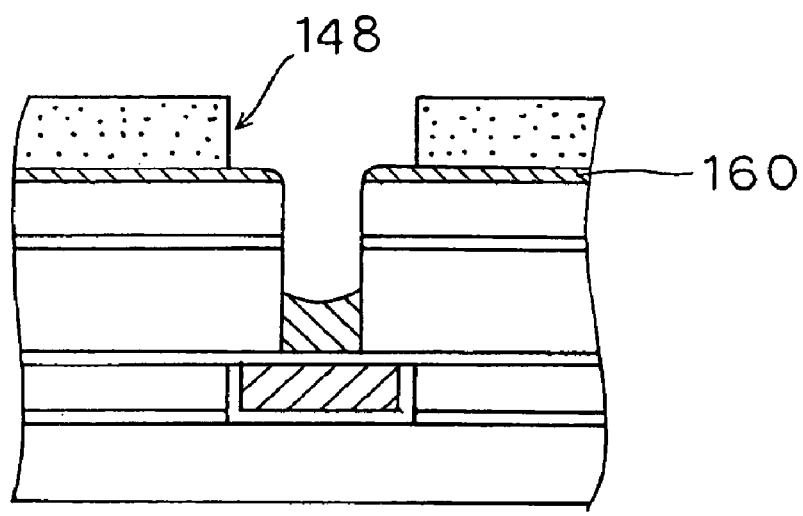
Figure 7J:
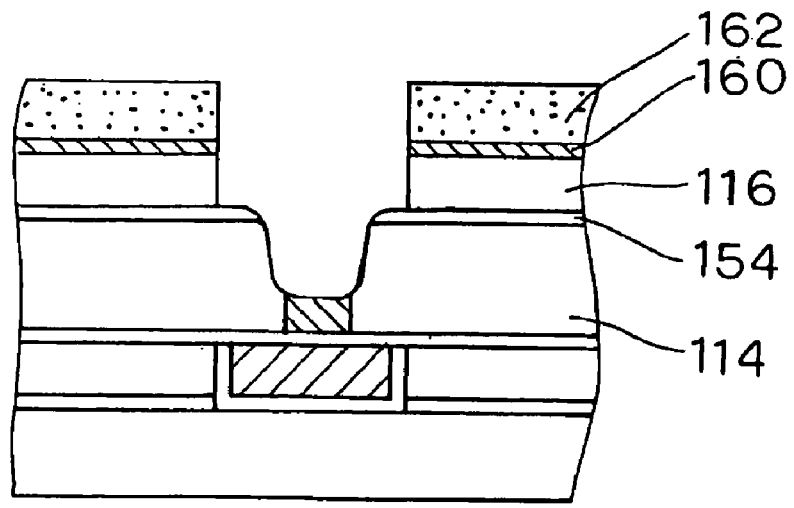
Figure 7K:
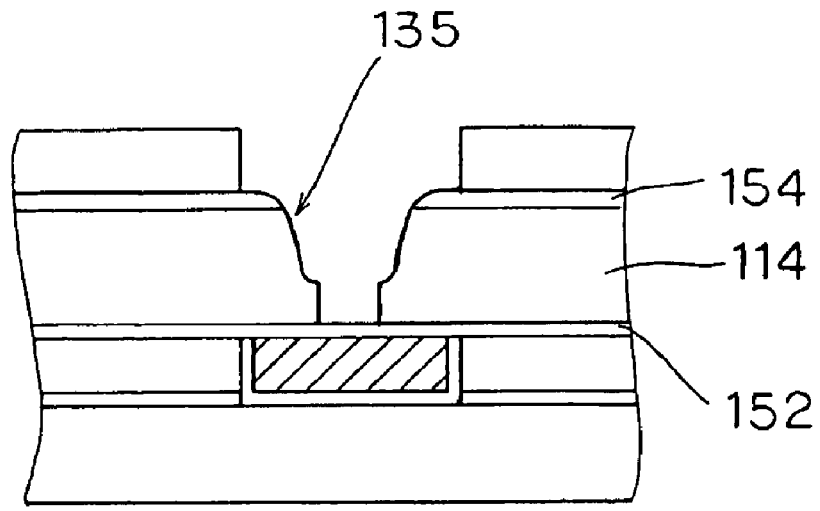
Figure 7L:
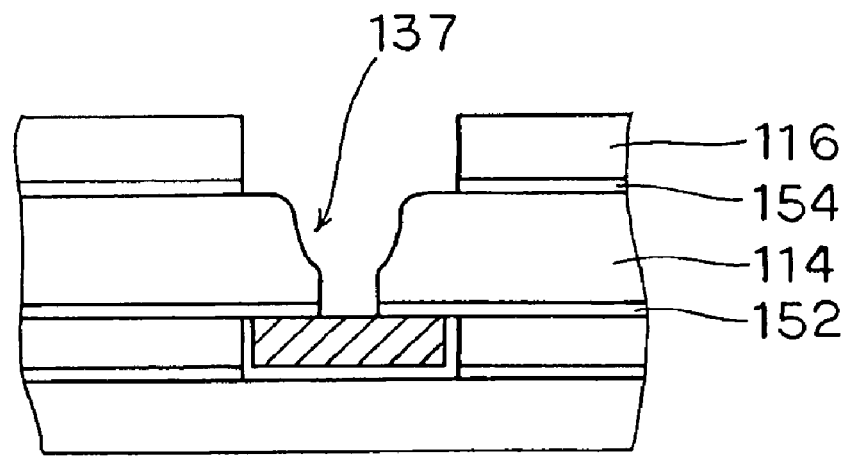
Figure 7M:
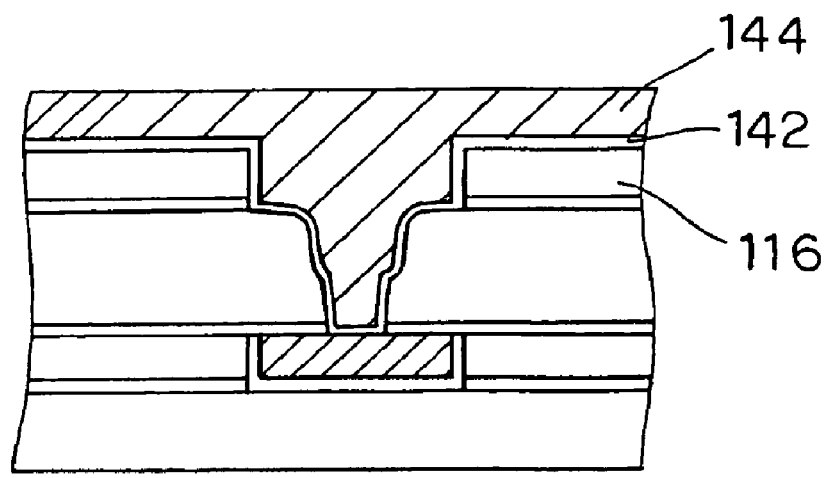
Figure 7N:
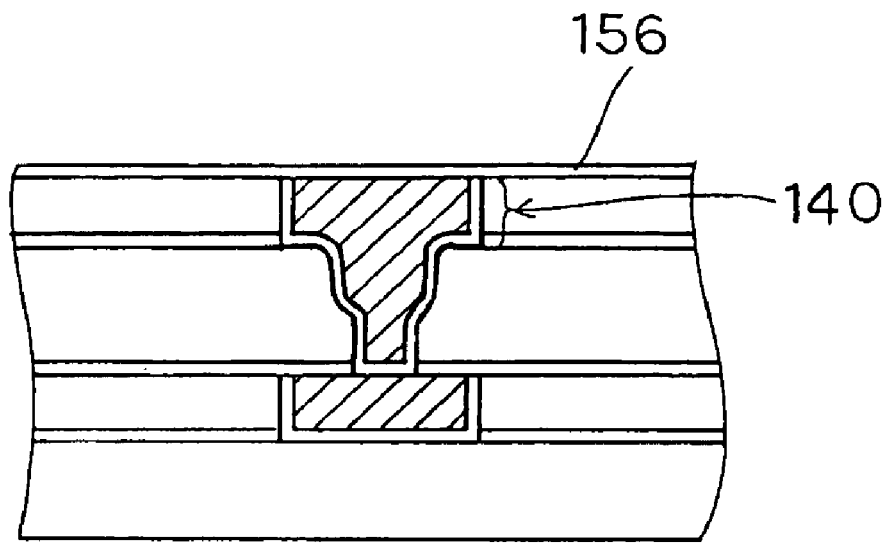

FIGS. 7A to 7N are sectional views showing the fabrication method of the semiconductor device of the present invention. Semiconductor elements such as transistors and resistors are formed on a semiconductor substrate that is not shown in the figure, but because the configuration of the semiconductor elements is similar to that of the prior art, explanation of the method of forming these elements is here omitted.

As shown in FIG. 7A, after forming the above-described semiconductor elements, a silicon oxide film is formed as lower dielectric film 110 having a film thickness of 400-700 nm by a plasma CVD (Chemical Vapor Deposition) method.

Next, Stopper-SiC film 150 having a thickness of 50-70 nm is formed, an L-Ox film having a thickness of 400-700 nm is formed as intralayer dielectric film 112, and a resist film is then applied over these films. Trench openings are next formed in the resist film by means of a known lithographic process. The resist film is used as a mask to remove Stopper-SiC film 150 and intralayer dielectric film 112, following which the resist film is removed.

After forming a barrier metal film 122 (FIG. 7B), a copper seed layer is formed, following which copper 124 is formed on the copper seed layer by means of an electroplating method (FIG. 7C).

As shown in FIG. 7D, copper 124 is next polished by means of a CMP (Chemical and Mechanical Polishing) method until the upper surface of intralayer dielectric film 112 is exposed, whereby interconnection 120 is formed.

Next, as shown in FIG. 7E, Cap-SiCN film 152 is formed to a thickness of 50-70 nm, and a silicon oxide film is formed to a thickness of 400-700 nm as interlayer dielectric film 114. Stopper-SiC film 154 is then formed to a film thickness of 50-70 nm, and an L-Ox film is formed to a film thickness of 400-700 nm as intralayer dielectric film 116.

Interlayer dielectric film 114, Stopper-SiC film 154, and intralayer dielectric film 116 are next removed by a known lithographic process and etching process until prescribed positions of the upper surface of Cap-SiCN film 152 are exposed as shown in FIG. 7F, whereby opening 134 for forming the via-hole is formed.

Next, anti-reflective coating (hereinbelow abbreviated as "ARC") 160 is applied in order that the resist film will not be exposed to light reflected by interconnection 120 in the subsequent lithography process (FIG. 7G). At this time, ARC 160 is applied such that the position of the upper surface of ARC 160 inside opening 134 that was shown in FIG. 7F is below the lower surface of Stopper-SiC film 154. In the following explanation, the opening in which ARC 160 is buried in opening 134 is referred to as opening 135. ARC 160 is an organic film in which polyvinyl phenol or polymethyl methacrylate is added to a base resin of polyimide or novolac.

As shown in FIG. 7H, after applying resist film 162 by means of a known lithographic process, trench opening 148 for forming interconnection 140 is formed in resist film 162 (FIG. 7I).

Using resist film 162 as a mask, plasma etching is carried out from trench opening 148 using a mixed gas of $CF_4$ and Ar in which the gas mixture ratio of $CF_4$:Ar equals 1:5 and the pressure is 13.3-53.2 Pa (100-400 mTorr).

By means of this plasma etching, not only is intralayer dielectric film 116 of trench opening 148 eliminated until the upper surface of Stopper-SiC film 154 is exposed, but the sidewalls of interlayer dielectric film 114 of opening 135 are also removed such that the diameter of the opening is greater at the top than at the base of the opening (FIG. 7J). At this time, interlayer dielectric film 114 is not etched as far as a position lower than the upper surface of ARC 160. ARC 160 below opening 135 serves as a protective film for preventing elimination of the via-hole sidewalls by etching.

Next, as shown in FIG. 7K, resist film 162 and ARC 160 are removed by performing an $O_2$ plasma ashing process and an organic stripping agent process. Plasma etching is next carried out from the trench opening that has been formed in intralayer dielectric film 116 using a mixed gas of $CHF_3$, $O_2$, and Ar. This plasma etching eliminates Stopper-SiC film 154 and Cap-SiCN film 152 that have been exposed on upper surfaces and forms via-hole 137 and a trench opening for interconnection 140 (FIG. 7L). At this time, the plug sidewall angle for the sidewalls of via-hole 137 at Cap-SiCN film 152 may be less than positive 90°.

Barrier metal film 142 and copper seed layer are next formed in succession, and copper 144 is embedded by an electroplating method in via-hole 137 and in the trench opening for interconnection 140 (FIG. 7M). At this time, the via-hole diameter is greater toward the via-hole top than at the via-hole base, and the step coverage of the copper seed layer and barrier metal film 142 that are formed in the via-hole is therefore excellent and the embedding of copper 144 is improved.

Copper 144 is next polished by means of a CMP method until the upper surface of intralayer dielectric film 116 is exposed to form interconnection 140, following which Cap-SiCN film 156 is formed to cover the upper surface of interconnection 140 (FIG. 7N). The semiconductor device shown In FIG. 2A is thus completed. After forming the structure shown in FIG. 2A, an interlayer dielectric film may also be additionally formed to form an interconnection on the upper layer.

The above-described fabrication method produces a shape in which the sidewalls of the via-hole drop monotonously from the via-hole top toward the via-hole base, and as a result, a shape is not produced in which the sidewall angles upward from a horizontal direction at midpoints of the sidewalls that drop toward the via-hole base. Further, the inclination of the sidewalls changes such that the via-hole diameter increases with progress along the via-hole sidewall from the via-hole base toward the via-hole top.

The smoother via-hole sidewalls, and moreover, smaller essential aspect ratio of the via-hole in the semiconductor device of the above-described working example brings about an improvement in the step coverage when forming the barrier metal film, resulting in excellent embedding of copper and the production of a via-plug and interconnection in which voids do not occur. It is further believed that this type of configuration tends to eliminate concentrations of stress inside the via-plug and can thus eliminate the starting points of void nucleation. Interconnections can thus be obtained that feature reduced stress migration in the via-plugs and high reliability. In particular, the suppression of concentrations of stress eliminates the occurrence of stress migration failures even when stress increases as a result of the increased width of interconnection 140. Still further, by making the plug sidewall angle a positive angle for any points of the via-plug sidewalls, the sidewall shape from the via-plug base to the via-plug top is formed for all of the via-plug sidewalls. As a result, the formation of shapes that would lead to the occurrence of stress concentration is prevented on all of the via-plug sidewalls.

Still further, making the plug sidewall angle at the point of Cap-SiCN film 152 that is shown in FIG. 2A less than 90° provides a still greater improvement in the embedding of metal in the via-hole interior and allows better prevention of the occurrence of voids.

Regarding the etching process that was shown in FIG. 7J, although a case was shown in which a mixed gas of $CF_4$ and Ar was used as the etching gas such that the etching rate of ARC 160 was greater than that of interlayer dielectric film 114, a mixed gas of $C_4F_8$ and Ar may also be used such that the etching rate of ARC 160 is less than that of interlayer dielectric film 114. $C_2F_6$ gas may also be used in place of $CF_4$.

Second Working Example

The present working example is a semiconductor device that is provided with a via-plug in which only a portion of the via-plug has the sidewall shape of the via-plug in the first working example.

The following explanation regards the semiconductor device of the present working example. Identical reference numerals are applied to components that are identical to those of the first working example and detailed explanation of such components is here omitted. In addition, the fabrication for this working example is identical to that of the first working example and explanation of this method is therefore here omitted.

Figure 8A:
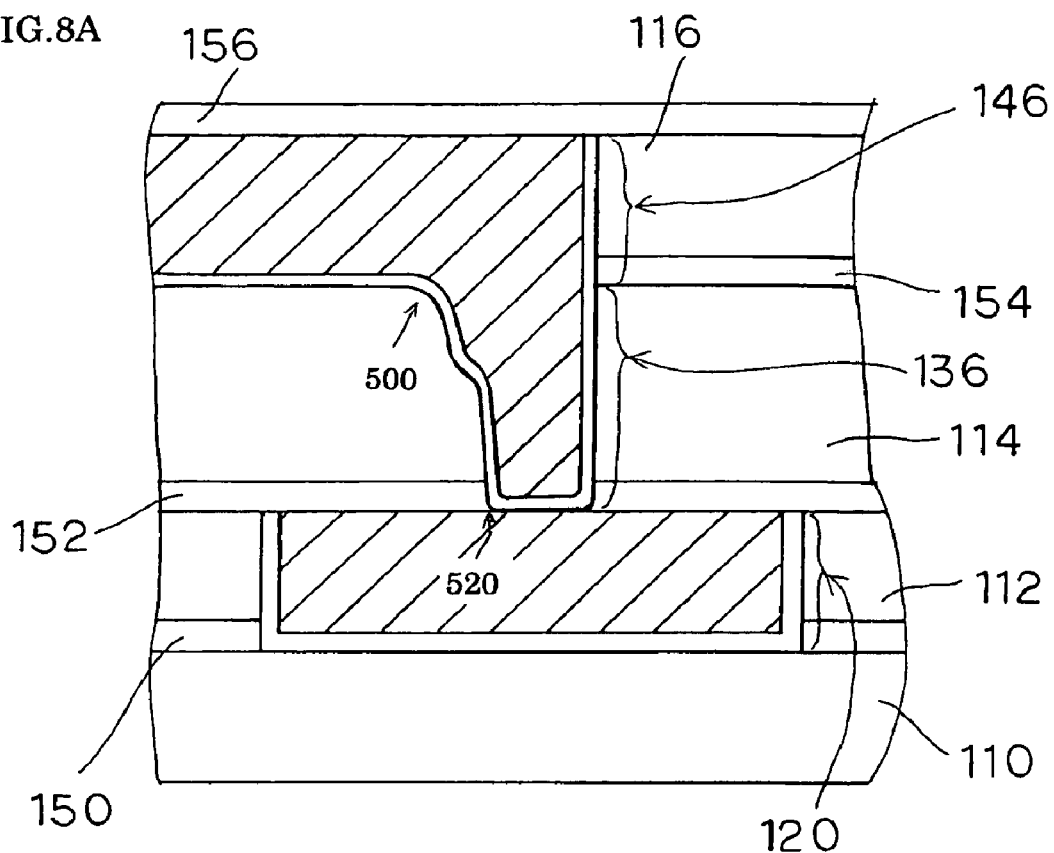
FIG. 8A is a sectional view showing the configuration of the semiconductor device of the second working example.

As shown in FIG. 8A, the semiconductor device of this working example is a configuration that includes: interconnection 120; via-plug 136 that is connected to interconnection 120; and interconnection 146 that is formed as a single unit with via-plug 136. Regarding the sectional shape of the via-plug sidewall that is shown in FIG. 8A, the left side of the figure is the same shape as in the first working example, but on the right side of the figure, the plug sidewall angle is uniform from the upper surface of interconnection 146 to the base of the via-plug. The plug sidewall angle of the sidewall on the right side of the figure may be within the range over 0° to a positive 90°.

Figure 8B:
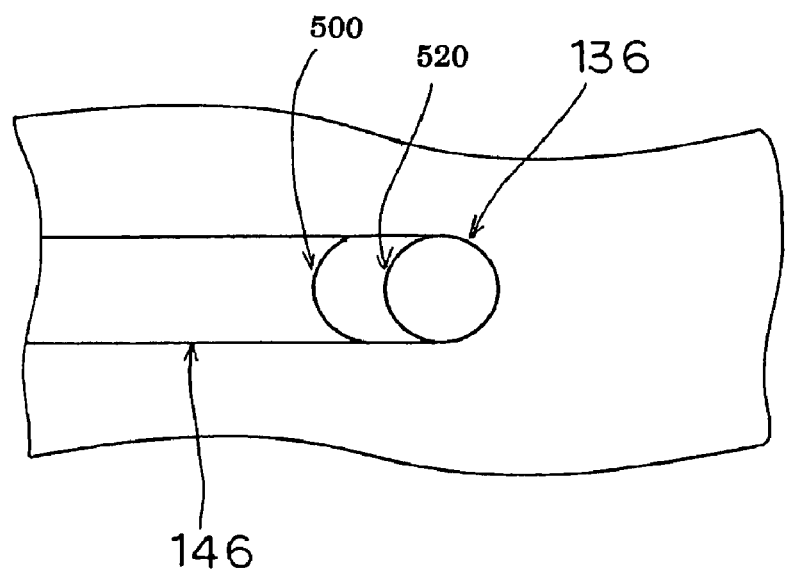
FIG. 8B is a plan view showing the configuration of the semiconductor device of the second working example.

FIG. 8B is a plan view showing the pattern of interconnection 146 and via-plug 136. Point 500 in FIG. 8B shows the via-plug top and point 520 shows the via-plug base. As shown in FIG. 8B, the pattern of interconnection 146 extends to the left of the figure from via-plug 136. As a result, the via-plug sidewall shape such as the shape shown in the first working example is not formed on the right-side portion of the sidewalls.

If the same shape as in the first working example is provided in the via-plug sidewalls at least from the via-plug top to the via-plug base as in the present working example, the same effects can be obtained as were obtained in the first working example.

Although the metal copper was used as the material of the above-described interconnections and via-plug in the above-described first working example and second working example, the metal may be an alloy that contains copper, or may be another metal such as aluminum or tungsten.

Further, although L-Ox film was used in intralayer dielectric films 112 and 116 as a low-dielectric-constant dielectric film having a lower dielectric constant than a silicon oxide film, the present invention is not limited to the use of L-Ox film. The low-dielectric-constant dielectric film may be an inorganic dielectric film such as either a SiOF film or a silicon oxide film containing carbon (SiOC film). Alternatively, the low-dielectric-constant dielectric film may be an organic dielectric film such as either a silicon oxide film containing a methyl group or a high-polymer film. Still further, intralayer dielectric films 112 and 116 may also be laminated films that include these low-dielectric-constant dielectric films. Although a case was shown in which interlayer dielectric film 114 was a silicon oxide film, interlayer dielectric film 114 may be a film that contains a low-dielectric-constant dielectric film. The use of a low-dielectric-constant dielectric film in intralayer dielectric films 112 and 116 and interlayer dielectric film 114 reduces the capacitance between interconnections.

Further, the etching stopper film is not limited to a SiC film and may be a SiCN film or a silicon nitride film having high etching selectivity with intralayer dielectric films. Still further, the metal diffusion prevention film is not limited to a SiCN film, and may also be a dielectric film such as a SiC film or a silicon nitride film that serves the purpose of preventing diffusion of metal.

While preferred embodiments of the present invention have been described using specific terms, such description is for illustrative purposes only, and it is to be understood that changes and variations may be made without departing from the spirit or scope of the following claims.

What is claimed is:

1. A fabrication method of a semiconductor device, said semiconductor device having a first interconnection, a via-plug that is connected to said first interconnection, and a second interconnection that is connected to said via-plug; said fabrication method comprising the steps of:
    successively forming on said first interconnection: a first metal diffusion prevention film, an interlayer dielectric film, an etching stopper film, and an intralayer dielectric film;
    using a lithographic process and an etching process to form a first opening in a prescribed opening pattern in said interlayer dielectric film, said etching stopper film, and said intralayer dielectric film;
    applying an antireflective coating for preventing a reflection of light by said first interconnection, and forming a second opening in said first opening in which said antireflective coating is buried such that a position of an upper surface of said antireflective coating is lower than a lower surface of said etching stopper film;
    forming a resist film having a prescribed pattern of trench openings in said intralayer dielectric film;
    performing etching with said resist film as a mask to form a trench opening in said intralayer dielectric film while said antireflective coating remains at a bottom of said first opening after said etching such that said antireflective coating covers sidewalls of said first opening only to a level of the upper surface of said antireflective coating, and forming sidewalls of said interlayer dielectric film of said second opening such that a diameter of said second opening is progressively larger from a bottom toward a top of said second opening by etching said interlayer dielectric film with said antireflective coating remaining at the bottom of said first opening as a mask;
    removing said resist film and said antireflective coating;
    etching from the trench opening that has been formed in said intralayer dielectric film to remove said etching stopper film and said first metal diffusion prevention film that have been exposed on upper surfaces and forming a via-hole that includes said second opening and the trench opening of said second interconnection; and
    embedding a metal in said via-hole and the trench opening of said second interconnection to form said via-plug and said second interconnection, and then forming a second metal diffusion prevention film.

2. The fabrication method of a semiconductor device according to claim 1, wherein:
    regarding a plug sidewall angle in a cross-sectional shape of said via-hole following formation of said via-hole, said plug sidewall angle being an angle formed between: a line that joins an arbitrary point of a sidewall of said via-hole and a point of intersection of a line that passes through said arbitrary point and that is parallel to a surface of said first interconnection and a central axis of said via-hole, and a line that joins said arbitrary point and a point of intersection between a tangent line at said arbitrary point and said central axis, an angle of depression from a line that is parallel to the surface of said first interconnection is a positive angle, and an angle of elevation from a line that is parallel to the surface of said first interconnection is a negative angle; and
    in the cross-sectional shape of said via-hole, said plug sidewall angle is a positive angle; and at least two points exist between a base and a top of said via-hole on at least one of two sidewalls of said via-hole cross-sectional shape at which said plug sidewall angle attains a maximum value.

3. A method of fabricating a semiconductor device having a first interconnection, a via-plug connected to said first interconnection, and a second interconnection connected to said via-plug, said fabrication method comprising:
    successively forming a first metal diffusion prevention film, an interlayer dielectric film, an etching stopper film, and an intralayer dielectric film above a first interconnection;
    forming an opening having a prescribed opening pattern in said interlayer dielectric film, said etching stopper film, and said intralayer dielectric film using a lithographic process and an etching process;
    filling said opening with an antireflective coating from a bottom portion of said opening to a level such that a position of an upper surface of said antireflective coating is lower than a lower surface of said etching stopper film;
    forming a resist film having a prescribed pattern of trench openings in said intralayer dielectric film;

performing etching with said resist film as a mask to form a trench opening in said intralayer dielectric film while said antireflective coating remains at a bottom of said opening after said etching such that said antireflective coating covers sidewalls of said opening only to a level of the upper surface of said antireflective coating, and forming sidewalls of interlayer dielectric film of said opening such that a diameter of said opening is progressively larger from the bottom toward a top of said opening by etching said interlayer dielectric film with said antireflective coating remaining at the bottom of said first opening as a mask;

removing said resist film and said antireflective coating;

etching from the trench opening that has been formed in said intralayer dielectric film to remove said etching stopper film and said first metal diffusion prevention film that have been exposed on upper surfaces and forming a via-hole that includes said opening and the trench opening of said second interconnection; and embedding a metal in said via-hole and the trench opening of said second interconnection to form said via-plug and said second interconnection, and then forming a second metal diffusion prevention film.

* * * * *